(12) United States Patent
Kawada et al.

(10) Patent No.: US 8,498,123 B2
(45) Date of Patent: Jul. 30, 2013

(54) UNIT HOLDING MECHANISM AND ELECTRONIC EQUIPMENT

(75) Inventors: Yoshihiro Kawada, Osaka (JP); Masaru Furujiku, Osaka (JP)

(73) Assignee: Panasonic Corporation, Osaka (JP)

( * ) Notice: Subject to any disclaimer, the term of this patent is extended or adjusted under 35 U.S.C. 154(b) by 235 days.

(21) Appl. No.: 13/006,623

(22) Filed: Jan. 14, 2011

(65) Prior Publication Data

US 2011/0205713 A1 Aug. 25, 2011

(30) Foreign Application Priority Data

Feb. 24, 2010 (JP) ................................ 2010-039097

(51) Int. Cl.
- H05K 5/00 (2006.01)
- H05K 1/14 (2006.01)
- H05K 7/00 (2006.01)
- G11B 5/016 (2006.01)

(52) U.S. Cl.
USPC ......... 361/732; 361/740; 361/747; 360/99.02

(58) Field of Classification Search
USPC ....................................... 360/99.02
See application file for complete search history.

(56) References Cited

U.S. PATENT DOCUMENTS

| | | | | |
|---|---|---|---|---|
| 5,005,092 A | * | 4/1991 | Shigenai et al. | 360/99.06 |
| 5,088,085 A | * | 2/1992 | Uehara | 720/631 |
| 5,091,898 A | * | 2/1992 | Bessho et al. | 720/638 |
| 5,227,957 A | * | 7/1993 | Deters | 361/679.32 |
| 5,359,489 A | * | 10/1994 | Hass et al. | 361/732 |
| 5,430,617 A | * | 7/1995 | Hsu | 361/818 |
| 5,587,854 A | * | 12/1996 | Sato et al. | 360/97.11 |
| 5,768,098 A | * | 6/1998 | Murayama | 361/679.09 |
| 5,812,370 A | * | 9/1998 | Moore et al. | 361/679.38 |
| 5,901,129 A | * | 5/1999 | Takahashi et al. | 720/738 |
| 6,038,130 A | * | 3/2000 | Boeck et al. | 361/735 |
| 6,147,872 A | * | 11/2000 | Roy | 361/754 |
| 6,172,845 B1 | * | 1/2001 | Tatehata et al. | 360/99.02 |
| 6,181,511 B1 | * | 1/2001 | Reynolds et al. | 360/99.06 |
| 6,234,821 B1 | * | 5/2001 | Tan | 439/328 |
| 6,270,365 B1 | * | 8/2001 | Nishioka | 439/159 |
| 6,377,451 B1 | * | 4/2002 | Furuya | 361/679.32 |
| 6,510,051 B2 | * | 1/2003 | Kim | 361/679.43 |
| 6,547,347 B2 | * | 4/2003 | Saito et al. | 312/223.1 |
| 6,587,348 B2 | * | 7/2003 | Kondo | 361/741 |
| 6,776,640 B2 | * | 8/2004 | Nishioka | 439/325 |

(Continued)

FOREIGN PATENT DOCUMENTS

JP 2002-182788 6/2002

*Primary Examiner* — Hoa C Nguyen
*Assistant Examiner* — Xanthia C Cunningham
(74) *Attorney, Agent, or Firm* — Hamre, Schumann, Mueller & Larson, P.C.

(57) ABSTRACT

In a unit holding mechanism, a first slide lever 31 and a second slide lever 32 are slidable in directions different from those of a third slide lever 41. Thus, it is possible to prevent an erroneous removal of battery units 21 and 22 and an HDD unit 23. More specifically, since the sliding directions of the slide switches vary with the type of unit to be loaded/unloaded, a user can identify the unit to be loaded/unloaded by examining only the sliding directions of the slide switches by the touch. Thus, even if the user attempts to remove the unit without viewing a bottom surface 1*b* of a first housing 1, it is possible to reduce the possibility of a misoperation in which a unit other than the intended unit is removed erroneously.

8 Claims, 6 Drawing Sheets

U.S. PATENT DOCUMENTS

| | | | |
|---|---|---|---|
| 6,947,290 B2* | 9/2005 | Hirata | 361/741 |
| 6,952,349 B2* | 10/2005 | Gough et al. | 361/741 |
| 7,133,296 B2* | 11/2006 | Choi et al. | 361/798 |
| 7,215,540 B2* | 5/2007 | Lien | 361/679.32 |
| 7,233,489 B2* | 6/2007 | Toyama et al. | 361/679.31 |
| 7,375,960 B2* | 5/2008 | Blaalid et al. | 361/679.33 |
| 7,843,698 B2* | 11/2010 | Takizawa et al. | 361/732 |
| 8,010,974 B2* | 8/2011 | Iwaasa | 720/647 |
| 2002/0027769 A1* | 3/2002 | Kasahara et al. | 361/683 |
| 2005/0231924 A1* | 10/2005 | Shih | 361/759 |

* cited by examiner

UNIT HOLDING MECHANISM AND ELECTRONIC EQUIPMENT

BACKGROUND

1. Field

The present application relates to a unit holding mechanism and electronic equipment using the same.

2. Description of Related Art

In recent years, some portable electronic equipment such as a laptop personal computer (hereinafter, referred to as a "laptop PC") includes a configuration for loading/unloading an information medium such as a hard disk drive (HDD) as well as a battery.

JP 2002-182788 A discloses a device for opening/closing electronic equipment that includes a storage portion for storing an HDD and a battery pack, in which the HDD and the battery pack can be stored overlapping each other.

However, with the configuration disclosed in JP 2002-182788 A, in order to remove the HDD from the electronic equipment, the battery pack has to be removed first, which makes it complicated to load/unload the HDD.

SUMMARY

A unit holding mechanism disclosed in the present application is capable of holding a plurality of units in a housing. The mechanism includes: a main slide lever that is provided on one main surface of the housing and is capable of locking a main unit among the plurality of units; and an auxiliary slide lever that is provided on the one main surface and is capable of locking an auxiliary unit among the plurality of units. The main slide lever and the auxiliary slide lever are slidable in directions different from each other.

In electronic equipment disclosed in the present application, a plurality of units can be loaded/unloaded in/from a housing. The equipment includes: a main slide lever that is provided on one main surface of the housing and is capable of locking a main unit among the plurality of units; and an auxiliary slide lever that is provided on the one main surface and is capable of locking an auxiliary unit among the plurality of units. The main slide lever and the auxiliary slide lever are slidable in directions different from each other.

DETAILED DESCRIPTION OF THE EMBODIMENTS

Embodiment 1

1. Configuration of Electronic Equipment

Figure 1:
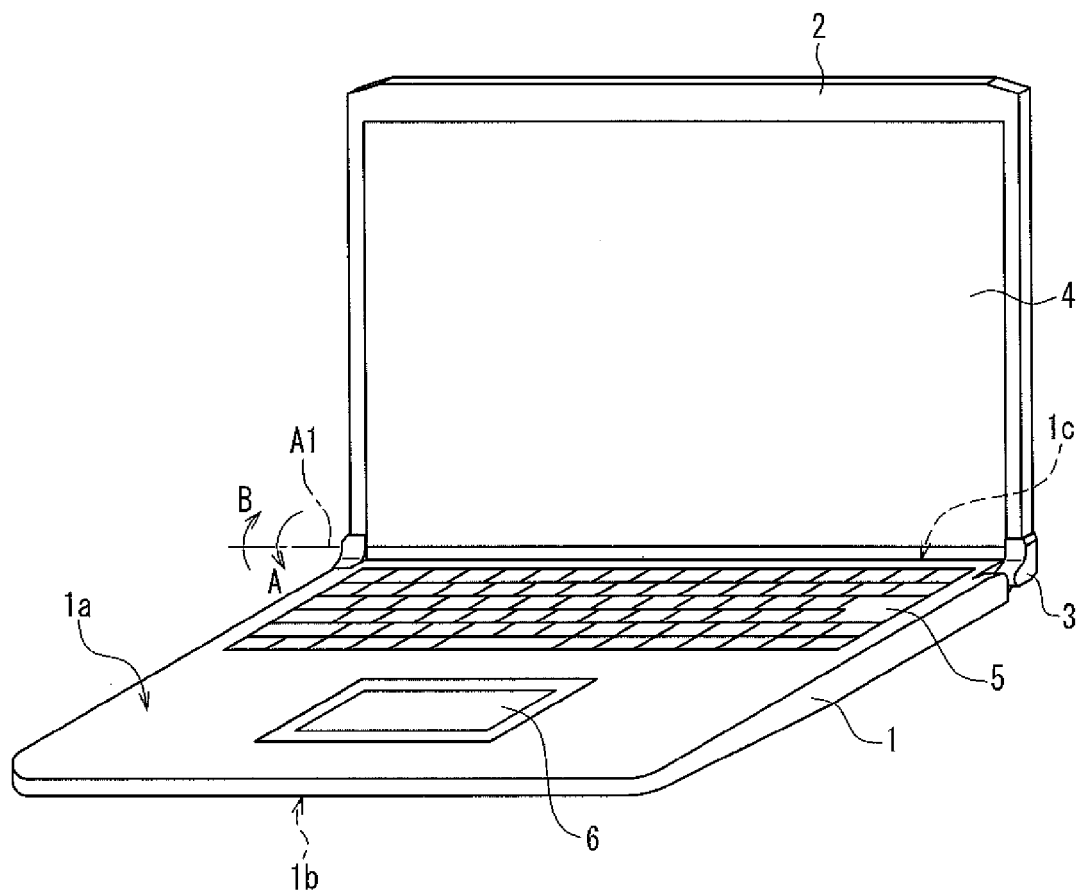
FIG. 1 is a perspective view of a laptop PC according to an embodiment.

FIG. 1 is an external perspective view of a laptop PC as an example of electronic equipment according to the present embodiment. Although the laptop PC is given as an example of the electronic equipment in the present embodiment, any equipment in/from which at least a battery, a hard disk drive, and the like can be loaded/unloaded is applicable. Further, although the electronic equipment is given as an example of a unit holding mechanism in the present embodiment, the present invention is not limited thereto as long as units can be held.

As shown in FIG. 1, the laptop PC includes a first housing 1 and a second housing 2. The first housing 1 incorporates a circuit board mounted with various electric elements, a hard disk drive, and the like. The second housing 2 includes a liquid crystal display 4. The first housing 1 and the second housing 2 are supported mutually rotatably by a hinge portion 3. The hinge portion 3 includes an axis about which the first housing 1 and the second housing 2 are supported rotatably.

A keyboard 5 and a pointing device 6 are provided on a top surface 1a of the first housing 1. The keyboard 5 receives an operation of inputting various characters by a user. The pointing device 6 operates by the user contacting an operation surface and is capable of moving a cursor displayed on the liquid crystal display 4 to a desired position.

Figure 2:
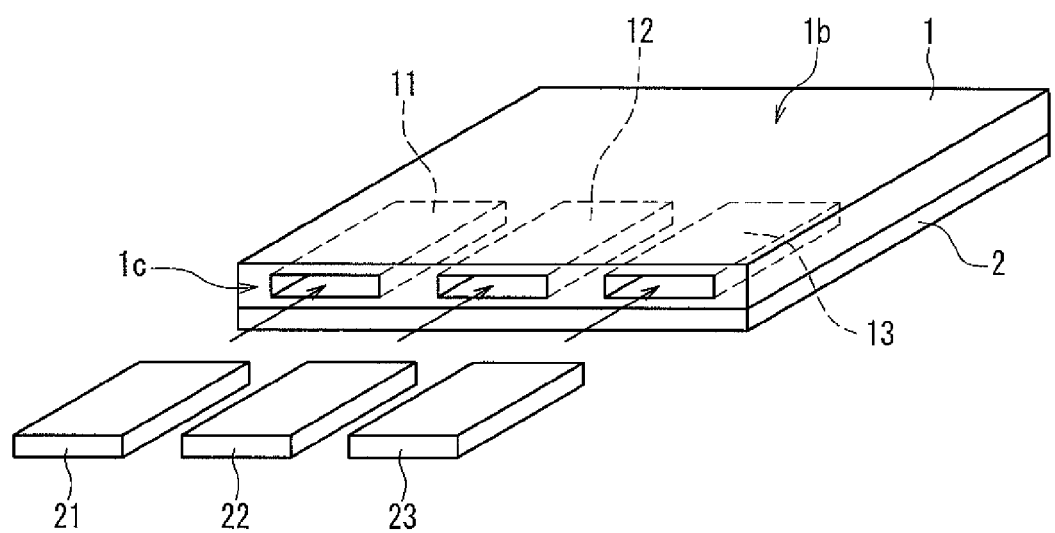
FIG. 2 is a perspective view of a bottom surface side of the laptop PC.

FIG. 2 is a perspective view of a bottom surface 1b side and a back surface 1c side of the laptop PC. The bottom surface 1b corresponds to a surface on the backside of the top surface 1a of the first housing 1. The back surface 1c corresponds to a surface that is located closest to an opening/closing axis A1 (see FIG. 1) of the hinge portion 3 among four surfaces adjacent to the top surface 1a and the bottom surface 1b of the first housing 1. The back surface 1c includes a first slot 11, a second slot 12, and a third slot 13. A first battery unit 21 can be inserted/removed into/from the first slot 11. A second battery unit 22 can be inserted/removed into/from the second slot 12. An HDD unit 23 can be inserted/removed into/from the third slot 13. It should be noted that the number of the slots is not limited to three.

Figure 3:
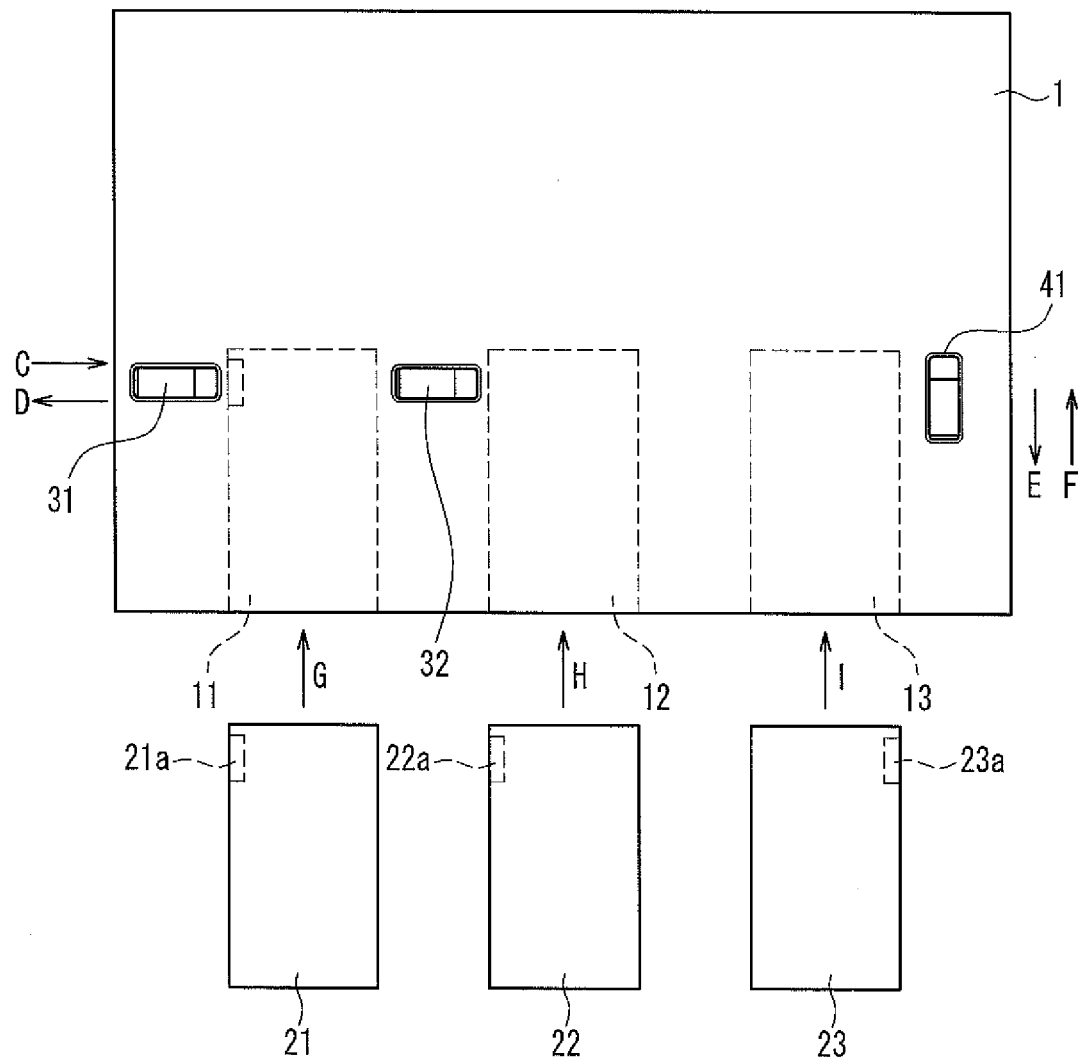
FIG. 3 is a plan view of the bottom surface side of the laptop PC.

FIG. 3 is a plan view of the bottom surface 1b side of the first housing 1. As shown in FIG. 3, a first slide lever 31, a second slide lever 32, and a third slide lever 41 are provided on the bottom surface 1b of the first housing 1. The first slide lever 31 is capable of locking the first battery unit 21 inserted into the first slot 11. The first slide lever 31 is slidable in a direction indicated by an arrow C or D. The second slide lever 32 is capable of locking the second battery unit 22 inserted into the second slot 12. The second slide lever 32 is slidable in the direction indicated by the arrow C or D. The third slide lever 41 is capable of locking the HDD unit 23 inserted into the third slot 13. The third slide lever 41 is slidable in a direction indicated by an arrow E or F. It should be noted that the number of the slide levers is not limited to three.

As shown in FIG. 3, the sliding directions (arrows C and D) of the first slide lever 31 and the second slide lever 32 are different from the sliding directions (arrows E and F) of the third slide lever 41. Although the respective slide levers are provided so that the sliding directions (arrows C and D) of the first slide lever 31 and the second slide lever 32 are orthogonal to the sliding directions (arrows E and F) of the third slide lever 41 in the present embodiment, it is not necessarily required that the slide levers are provided so that their sliding directions are orthogonal to each other, as long as they are slidable at least in directions different from each other. Further, although the first slide lever 31 and the second slide lever 32 have the same shape as that of the third slide lever 41 in the present embodiment, they may have different shapes. If the slide levers have different shapes, the user can distinguish the respective slide levers.

The first battery unit 21 has a concave portion 21*a* on one side surface. The second battery unit 22 has a concave portion 22*a* on one side surface. The HDD unit 23 has a concave portion 23*a* on one side surface.

Figure 4A:
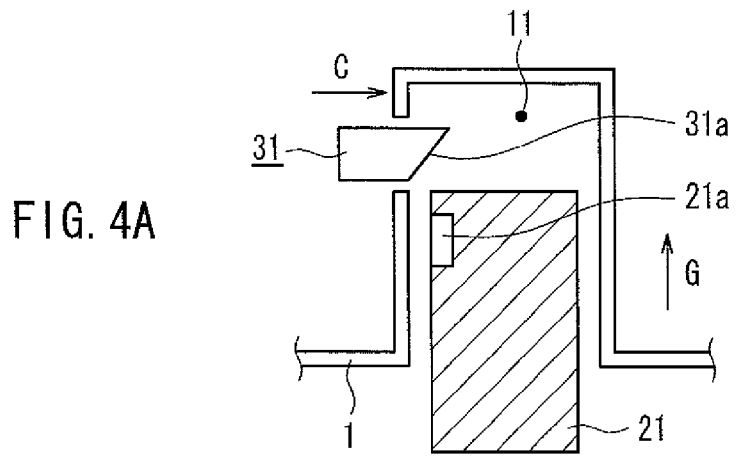
FIG. 4A is a schematic view showing a configuration for loading/unloading a battery.
Figure 4B:
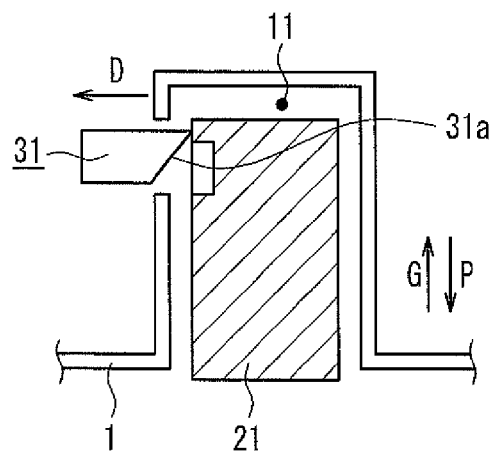
FIG. 4B is a schematic view showing the configuration for loading/unloading the battery.
Figure 4C:
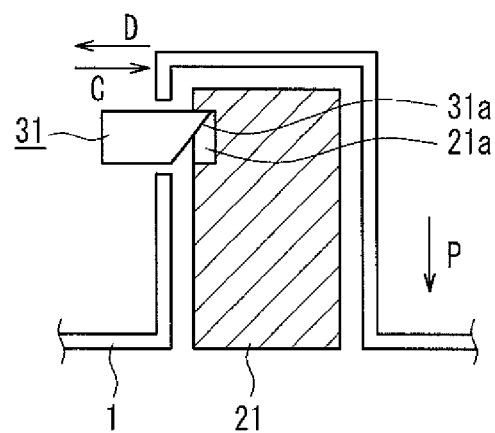
FIG. 4C is a schematic view showing the configuration for loading/unloading the battery.

FIGS. 4A to 4C are schematic views showing an operation of loading/unloading the battery unit 21 in/from the first slot 11. The first slide lever 31 is biased in a direction indicated by an arrow K by a biasing means (not shown) such as a spring and is held at a position shown in FIG. 4A.

In order to load the first battery unit 21 in the first slot 11, initially, the first battery unit 21 is inserted into the first slot 11 in a direction indicated by an arrow G as shown in FIG. 4A. When the first battery unit 21 is inserted in the direction indicated by the arrow G, an end of the first battery unit 21 soon comes into contact with a locking portion 31*a* of the first slide lever 31 that protrudes to the inside of the first slot 11. When the first battery unit 21 that has come into contact with the locking portion 31*a* further is displaced in the direction indicated by the arrow G, the first slide lever 31 is displaced in the direction indicated by the arrow D against a biasing force of the biasing means (not shown) as shown in FIG. 4B. When the first battery unit 21 is displaced to a position shown in FIG. 4C, the first slide lever 31 is displaced in the direction indicated by the arrow C by the biasing force of the biasing means (not shown), so that the locking portion 31*a* is engaged with the concave portion 21*a* of the first battery unit 21. As a result, the displacement of the first battery unit 21 in a direction (removal direction) indicated by an arrow P is regulated.

In the state shown in FIG. 4C, in order to remove the first battery unit 21, the first slide lever 31 is slid in the direction indicated by the arrow D, so that the locking portion 31*a* is removed from the concave portion 21*a*. From this state, when the first battery unit 21 is pulled out in the direction indicated by the arrow P, the first battery unit 21 assumes the state shown in FIG. 4B and then can be removed from the first slot 11 as shown in FIG. 4A. In the state shown in FIG. 4A, the first slide lever 31 is displaced in the direction indicated by the arrow C by the biasing means (not shown).

Although not shown and described, the second battery unit 22 can be loaded/unloaded in/from the second slot 12 by the same operation as that shown in FIGS. 4A to 4C.

Figure 5A:
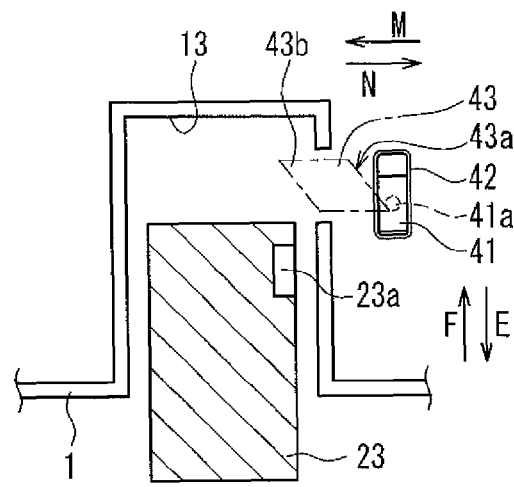
FIG. 5A is a schematic view showing a configuration for loading/unloading an HDD.
Figure 5B:
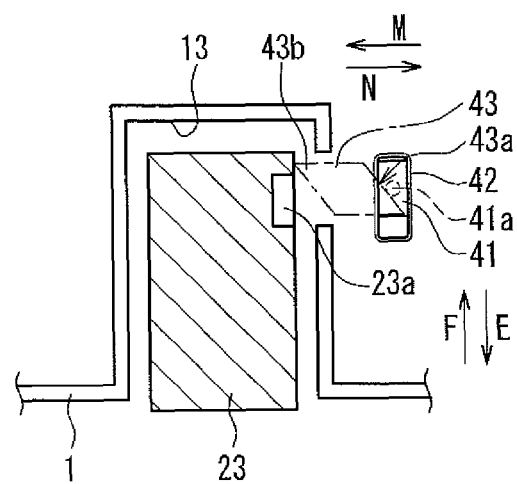
FIG. 5B is a schematic view showing the configuration for loading/unloading the HDD.
Figure 5C:
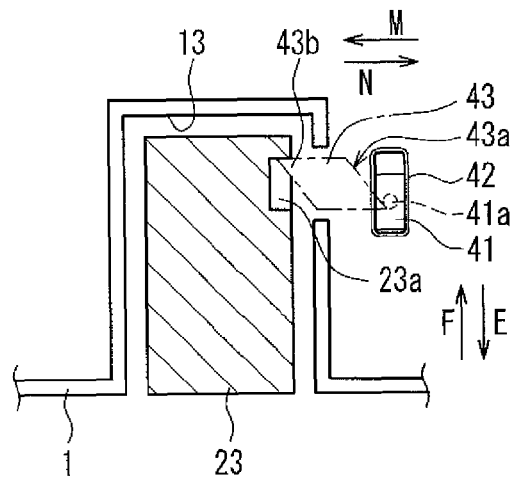
FIG. 5C is a schematic view showing the configuration for loading/unloading the HDD.

FIGS. 5A to 5C are schematic views showing an operation of loading/unloading the HDD unit 23 in/from the third slot 13.

As shown in FIGS. 5A to 5C, the third slide lever 41 is supported on the first housing 1 so as to be slidable linearly in the direction indicated by the arrow E or F. The third slide lever 41 is biased in a direction indicated by an arrow M by a biasing means (not shown) such as a spring. It should be noted that FIGS. 5A and 5C show a state where the third slide lever 41 is located at a protruding position, while FIG. 5B shows a state where the third slide lever 41 is located at a retracted position. The third slide lever 41 includes a protruding portion 41*a* on a rear surface. The rear surface corresponds to a surface on the backside of a front surface of the third slide lever 41 that is exposed on the bottom surface 1*b* side of the first housing 1. Although the protruding portion 41*a* has a cylindrical shape in the present embodiment, it may have another shape. The third slide lever 41 is guided by a guide portion 42 when slid in the direction indicated by the arrow M or N. On the backside of the third slide lever 41, a regulating member 43 is provided.

The regulating member 43 can be displaced in the direction indicated by the arrow M or N. The regulating member 43 has an inclined surface 43*a* that can come into contact with the protruding portion 41*a*. When the regulating member 43 is displaced in the direction indicated by the arrow M or N, the inclined surface 43*a* presses the protruding portion 41*a*, so that the third slide lever 41 can be displaced in the direction indicated by the arrow E or F. Further, when the third slide lever 41 is displaced in the direction indicated by the arrow E or F, the regulating member 43 can be displaced in the direction indicated by the arrow M or N. The regulating member 43 has a locking portion 43*b* that can be engaged with the concave portion 23*a* of the HDD unit 23. In view of smoothness during sliding, wear resistance, and cost, the regulating member 43 preferably is made of an acetal resin, polytetrafluoroethylene, or the like.

In order to load the HDD unit 23 in the third slot 13, initially, the HDD unit 23 is displaced in the direction indicated by the arrow F so as to be inserted into the slot as shown in FIG. 5A. When the HDD unit 23 is inserted until it comes into contact with the locking portion 43*b* of the third slide lever 41, and further is displaced in the direction indicated by the arrow F, the regulating member 43 pressed by the HDD unit 23 is displaced in the direction indicated by the arrow N and runs onto a side surface of the HDD unit 23 as shown in FIG. 5B.

When the HDD unit 23 further is displaced in the direction indicated by the arrow F from the state shown in FIG. 5B until the regulating member 43 is opposed to the concave portion 23*a*, the regulating member 43 is displaced in the direction indicated by the arrow M by the biasing means (not shown), so that the locking portion 41*b* is engaged with the concave portion 23*a* as shown in FIG. 5C. When the locking portion 41*b* is engaged with the concave portion 23*a*, the displacement of the HDD unit 23 in the direction (removal direction) indicated by the arrow E is regulated.

In the state shown in FIG. 5C, in order to remove the HDD unit 23 from the third slot 13, the third slide lever 41 is displaced in the direction indicated by the arrow F. Following the displacement of the third slide lever 41, the protruding portion 41*a* also is displaced in the direction indicated by the arrow F. When the protruding portion 41*a* is displaced in the direction indicated by the arrow F, the regulating member 43 that is biased so as to be in contact with the protruding portion 41*a* is displaced in the direction indicated by the arrow N. When the regulating member 43 is displaced in the direction indicated by the arrow N, and the locking portion 43*b* is removed from the concave portion 23*a*, the HDD unit 23 can be displaced in the direction indicated by the arrow E. Then, the HDD unit 23 is pulled out from the third slot 13 in the direction indicated by the arrow E, with care taken not to drop the HDD unit 23 accidentally.

The third slide lever 41 should be kept in the position displaced in the direction indicated by the arrow F until it assumes the state shown in FIG. 5B from the state shown in FIG. 5C, i.e., until the locking portion 43*b* removed from the concave portion 23*a* is not opposed to the concave portion 23*a*.

2. Effect of Embodiment Etc.

According to the present embodiment, the sliding directions of the first slide lever 31 and the second slide lever 32 are different from the sliding directions of the third slide lever 41. Thus, it is possible to prevent an erroneous removal of the battery units 21 and 22 and the HDD unit 23. More specifically, since the sliding directions of the slide switches vary with the type of unit to be loaded/unloaded, the user can identify the unit to be loaded/unloaded by examining only the sliding directions of the slide switches by the touch. Consequently, even if the user attempts to remove the unit without viewing the bottom surface 1b of the first housing 1, it is possible to reduce the possibility of a misoperation in which a unit other than the intended unit is removed erroneously.

In general, the laptop PC is held or placed in use in a state where the top surface 1a of the first housing 1 is visible. Thus, it is often difficult to view the bottom surface 1b. When loading/unloading the battery unit or the HDD unit in/from such a laptop PC, the user operates the slide lever provided on the bottom surface 1b while holding the first housing 1 with one hand or both hands. In other words, the user performs this operation without viewing the slide levers. However, if the slide lever for loading/unloading the battery unit is slid in the same directions as those of the slide lever for loading/unloading the HDD unit, the user is required to view the slide levers to identify the slide lever to operate, which is very complicated. If the user does not view the slide levers, a unit other than the unit to be removed may be removed erroneously. In particular, if the HDD unit is removed from the laptop PC while an operating system of the laptop PC is up and running, data stored on the HDD may be corrupted. Thus, the erroneous removal as described above should be avoided. According to the present embodiment, the sliding directions of the slide levers 31 and 32 for loading/unloading the battery units are different from the sliding directions of the slide lever 41 for loading/unloading the HDD unit. Thus, the user can identify the slide lever to operate only by the touch without viewing the bottom surface 1b, resulting in an easy removal operation. Further, it is possible to reduce the possibility that a unit other than the unit to be removed is removed erroneously, and thus a problem such as HDD corruption hardly arises.

Although the first battery unit 21 and the second battery unit 22 are provided in the present embodiment; only one or three or more battery units may be provided.

Further, although the HDD unit 23 is provided in the present embodiment, the present invention is not limited thereto, and any unit that is at least different from the battery unit in function or feature, such as a memory unit with a semiconductor memory and a disk drive in/from which a disk-shaped information medium can be loaded/unloaded, is also applicable.

Further, although the sliding directions of the first slide lever 31 and the second slide lever 32 are orthogonal to the directions in which the battery units 21 and 22 are loaded/unloaded, and the sliding directions of the third slide lever 41 are the same as the directions in which the HDD unit 23 is loaded/unloaded in the present embodiment, this is only an example. It is only required that the sliding directions of the first slide lever 31 and the second slide lever 32 are at least different from the sliding directions of the third slide lever 41. For example, the sliding directions of the first slide lever 31 and the second slide lever 32 may be the same as the directions in which the battery units 21 and 22 are loaded/unloaded, and the sliding directions of the third slide lever 41 may be orthogonal to the directions in which the HDD unit 23 is loaded/unloaded.

Further, it is not necessarily required that the sliding directions of the first slide lever 31 and the second slide lever 32 are orthogonal to the sliding directions of the third slide lever 41.

Although the sliding directions of the first slide lever 31 are the same as the sliding directions of the second slide lever 32 in the present embodiment, they may be different from each other. Further, the sliding directions of the first slide lever 31, the sliding directions of the second slide lever 32, and the sliding directions of the third slide lever 41 may be different from one another.

Further, although the first slide lever 31, the second slide lever 32, and the third slide lever 41 have a rectangular shape in the present embodiment, they may have shapes different from one another. If each of the slide levers has a different shape, the user can identify an arbitrary slide lever by the touch without viewing the slide levers. Thus, the user can operate an arbitrary slide lever without viewing the bottom surface 1b side.

Further, although the third slide lever 41 is slidable linearly in the present embodiment, it may be slidable along a curve. A configuration of a slide lever that is slidable in a curve will be described with reference to FIGS. 6A to 6C.

Figure 6A:
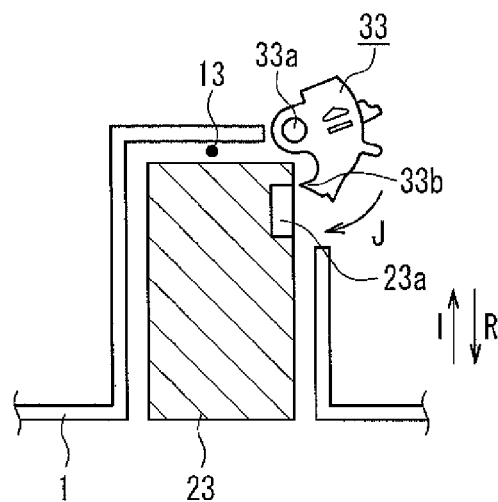
FIG. 6A is a schematic view showing a modified example of the configuration for loading/unloading the HDD.
Figure 6B:
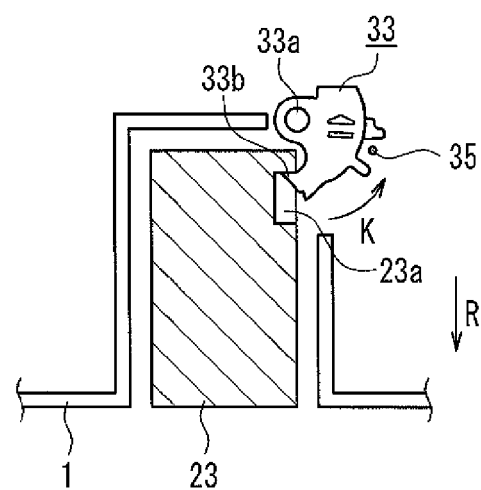
FIG. 6B is a schematic view showing the modified example of the configuration for loading/unloading the HDD.
Figure 6C:
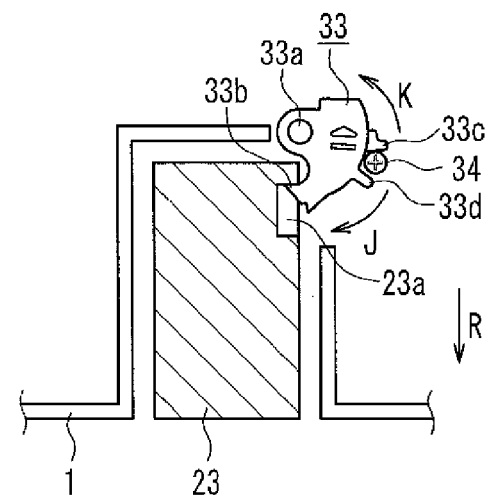
FIG. 6C is a schematic view showing the modified example of the configuration for loading/unloading the HDD.

FIGS. 6A to 6C are schematic views showing an operation of loading/unloading the HDD unit 23 in/from the third slot 13. As shown in FIGS. 6A to 6C, a third slide lever 33 includes a hole portion 33a. A screw (not shown) fixed to the first housing 1 is inserted into the hole portion 33a, so that the third slide lever 33 is supported by the first housing 1 so as to be rotatable in a direction indicated by an arrow J or K. It should be noted that FIG. 6A shows a state where the third slide lever 33 is located at a retracted position, while FIGS. 6B and 6C show a state where the third slide lever 33 is located at a protruding position. The third slide lever 33 further includes a lug-like locking portion 33b. The locking portion 33b can be engaged with the concave portion 23a formed on the HDD unit 23. The third slide lever 33 further includes rotation regulating portions 33c and 33d. The rotation regulating portions 33c and 33d are formed so as to protrude from the third slide lever 33. The rotation regulating portions 33c and 33d are spaced such that they are at least opposed to each other with a screw 34 screwed into a screw hole 35 (see FIG. 6B) interposed therebetween.

In order to load the HDD unit 23 in the third slot 13, initially, the HDD unit 23 is displaced in a direction indicated by an arrow I so as to be inserted into the slot as shown in FIG. 6A. Then, the third slide lever 33 is rotated in the direction indicated by the arrow J from the retracted position shown in FIG. 6A, so that the locking portion 33b is engaged with the concave portion 23a as shown in FIG. 6B. When the locking portion 33b is engaged with the concave portion 23a, the displacement of the HDD unit 23 in a direction (removal direction) indicated by an arrow R is regulated.

In the state shown in FIG. 6B, the third slide lever 33 is easily rotatable in the direction indicated by the arrow K. If the third slide lever 33 is rotated unexpectedly in the direction indicated by the arrow K, the locking portion 33b may be removed from the concave portion 23a, causing the HDD unit 23 to fall out of the third slot 13. If the HDD unit 23 falls out of the third slot 13 and is dropped on the floor or the like, the HDD unit 23 may be damaged by drop impact. To avoid this, according to the present embodiment, the screw 34 can be screwed into the screw hole 35 provided on the first housing 1 in the state where the third slide lever 33 is displaced to the protruding position shown in FIG. 6B.

As shown in FIG. 6C, when the screw 34 is screwed into the screw hole (see FIG. 6B), the screw 34 is located between the rotation regulating portion 33c and the rotation regulating portion 33d. Thus, even if an attempt is made to rotate the third slide lever 33 in the direction indicated by the arrow J or K, the rotation of the third slide lever 33 is regulated by the rotation regulating portion 33c or 33d coming into contact with the screw 34. Consequently, due to the screw 34 screwed into the screw hole 35, the locking portion 33b cannot be removed from the concave portion 23a, whereby the HDD unit 23 can be prevented from falling out of the third slot 13.

In the state shown in FIG. 6C, in order to remove the HDD unit 23 from the third slot 13, the screw 34 is removed from the screw hole 35 (see FIG. 6B), and the third slide lever 33 is rotated in the direction indicated by the arrow K. As a result, as shown in FIG. 6A, the locking portion 33b is removed from the concave portion 23a, so that the HDD unit 23 can be displaced in the direction indicated by the arrow R. Then, the HDD unit 23 is pulled out from the third slot 13, with care taken not to drop the HDD unit 23 accidentally.

In the configuration shown in FIGS. 6A to 6C, the first slide lever 31 and the second slide lever 32 have a rectangular shape, and the third slide lever 33 has a sectoral shape. In this manner, when the slide levers vary in shape with the type of unit to be loaded/unloaded, the user can identify the intended unit by viewing or touching the shapes of the slide levers. Thus, it is possible to reduce the possibility of a misoperation in which a unit other than the intended unit is removed erroneously.

Further, since the third slide lever 33 includes the rotation regulating portion 33c and the rotation regulating portion 33d, and the screw 34 can be screwed between the rotation regulating portions 33c and 33d as shown in FIGS. 6A to 6C, the sliding operation of the third slide lever 33 can be regulated. Thus, it is possible to prevent the HDD unit 23 from easily falling out due to an unexpected sliding operation of the third slide lever 33.

Although the configuration shown in FIGS. 6A to 6C includes the screw 34 to regulate the rotation of the third slide lever 33 in, it is not necessarily required to take the form of the screw. Any member that can at least act on a part of the third slide lever 33 to regulate the rotation of the third slide lever 33 is applicable. For example, a pin may be mounted between the rotation regulating portions 33c and 33d.

Further, although the configuration shown in FIGS. 6A to 6C includes the configuration for regulating the rotation of the third slide lever 33, it is also possible to provide a configuration for regulating the sliding operation of the first slide lever 31 or the second slide lever 32. For example, if a regulating member such as the screw 34 is provided in the vicinity of the first slide lever 31, the sliding operation of the first slide lever 31 is regulated, whereby the first battery unit 21 can be prevented from falling out unexpectedly.

The laptop PC in the present embodiment is an exemplary unit holding mechanism and exemplary electronic equipment. The first slide lever 31 and the second slide lever 32 in the present embodiment are exemplary main slide levers. The third slide levers 33 and 41 in the present embodiment are exemplary auxiliary slide levers. The first battery unit 21 and the second battery unit 22 in the present embodiment are exemplary main units. The HDD unit 23 in the present embodiment is an exemplary auxiliary unit. The rotation regulating portions 33c and 33d and the screw 34 in the present embodiment are an exemplary regulating member.

The electronic equipment of the present application is useful as equipment in/from which various units can be loaded/unloaded.

The application may be embodied in other forms without departing from the spirit or essential characteristics thereof. The embodiments disclosed in this application are to be considered in all respects as illustrative and not limiting. The scope of the application is indicated by the appended claims rather than by the foregoing description, and all changes which come within the meaning and range of equivalency of the claims are intended to be embraced therein.

What is claimed is:

1. A unit holding mechanism capable of holding a plurality of units in a housing, the mechanism comprising:
a main slide lever that is provided on one main surface of the housing and is capable of locking a main unit among the plurality of units; and
an auxiliary slide lever that is provided on the one main surface and is capable of locking an auxiliary unit among the plurality of units,
wherein the main slide lever and the auxiliary slide lever are slidable in directions different from each other,
the main slide lever is slidable in the same direction as a direction in which the main unit is loaded/unloaded, and
the auxiliary slide lever is slidable in a direction orthogonal to a direction in which the auxiliary unit is loaded/unloaded.

2. The unit holding mechanism according to claim 1, wherein the main unit is a battery unit, and
the auxiliary unit is a unit with an information medium.

3. The unit holding mechanism according to claim 1, wherein the main slide lever and the auxiliary slide lever have shapes different from each other.

4. The unit holding mechanism according to claim 1, further comprising a regulating member that is capable of regulating a sliding operation of at least one of the main slide lever and the auxiliary slide lever.

5. Electronic equipment in which a plurality of units can be loaded/unloaded in/from a housing, the equipment comprising:
a main slide lever that is provided on one main surface of the housing and is capable of locking a main unit among the plurality of units; and
an auxiliary slide lever that is provided on the one main surface and is capable of locking an auxiliary unit among the plurality of units,
wherein the main slide lever and the auxiliary slide lever are slidable in directions different from each other,
the main slide lever is slidable in the same direction as a direction in which the main unit is loaded/unloaded, and
the auxiliary slide lever is slidable in a direction orthogonal to a direction in which the auxiliary unit is loaded/unloaded.

6. The electronic equipment according to claim 5, wherein the main unit is a battery unit, and
the auxiliary unit is a unit with an information medium.

7. The electronic equipment according to claim 5, wherein the main slide lever and the auxiliary slide lever have shapes different from each other.

8. The electronic equipment according to claim 5, further comprising a regulating member that is capable of regulating a sliding operation of at least one of the main slide lever and the auxiliary slide lever.

* * * * *